US012672269B2

(12) United States Patent
Nakagawa

(10) Patent No.: US 12,672,269 B2
(45) Date of Patent: Jun. 30, 2026

(54) ELECTRONIC COMPONENT CONTAINER

(71) Applicant: Murata Manufacturing Co., Ltd., Nagaokakyo (JP)

(72) Inventor: Kiyoyuki Nakagawa, Nagaokakyo (JP)

(73) Assignee: MURATA MANUFATURING CO., LTD., Kyoto (JP)

( * ) Notice: Subject to any disclaimer, the term of this patent is extended or adjusted under 35 U.S.C. 154(b) by 275 days.

(21) Appl. No.: 18/617,692

(22) Filed: Mar. 27, 2024

(65) Prior Publication Data

US 2024/0237320 A1 Jul. 11, 2024

Related U.S. Application Data

(63) Continuation of application No. PCT/JP2022/041338, filed on Nov. 7, 2022.

(30) Foreign Application Priority Data

Jan. 12, 2022 (JP) ................................. 2022-003060

(51) Int. Cl.
| | |
|---|---|
| *B65D 25/30* | (2006.01) |
| *B65D 25/52* | (2006.01) |
| *H05K 13/00* | (2006.01) |

(52) U.S. Cl.
CPC ......... *H05K 13/0084* (2013.01); *B65D 25/30* (2013.01); *B65D 25/52* (2013.01)

(58) Field of Classification Search
CPC ........................... H05K 13/0084; B65D 25/30
See application file for complete search history.

(56) References Cited

U.S. PATENT DOCUMENTS

| | | | |
|---|---|---|---|
| 8,521,326 B1 * | 8/2013 | Holtje | G07F 17/0092 |
| | | | 221/12 |
| 11,622,914 B2 * | 4/2023 | Hayman | A61J 7/0053 |
| | | | 221/195 |
| 2003/0183553 A1 | 10/2003 | Fujimura et al. | |
| 2015/0108038 A1 | 4/2015 | Hsu et al. | |
| 2016/0130071 A1 * | 5/2016 | Li | B65D 85/60 |
| | | | 221/174 |
| 2016/0268569 A1 | 9/2016 | Yashiki | |

(Continued)

FOREIGN PATENT DOCUMENTS

| | | |
|---|---|---|
| JP | H0228490 U | 2/1990 |
| JP | H10160680 A | 6/1998 |

(Continued)

OTHER PUBLICATIONS

Official Communication issued in corresponding Japanese Patent Application No. 2023-573860, mailed on Nov. 11, 2025, 3 pages.

(Continued)

*Primary Examiner* — Gene O Crawford
*Assistant Examiner* — Ayodeji T Ojofeitimi
(74) *Attorney, Agent, or Firm* — Keating & Bennett, LLP

(57) ABSTRACT

An electronic component container includes a component accommodating space to accommodate electronic components, and a discharge port through which the electronic components accommodated in the component accommodating space are dischargeable to an outside. An inner wall surface of the component accommodating space has a skewness Rsk of about −0.8 or greater and about −0.3 or less.

20 Claims, 6 Drawing Sheets

(56)                    References Cited

U.S. PATENT DOCUMENTS

| 2019/0092557 A1* | 3/2019 | Li | ........................... | B65D 85/60 |
| 2022/0048694 A1* | 2/2022 | Afzali | ....................... | A61J 1/03 |

FOREIGN PATENT DOCUMENTS

| JP | 2000281169 A | 10/2000 |
| JP | 2002173194 A | 6/2002 |
| JP | 2005035636 A | 2/2005 |
| JP | 2007045641 A | 2/2007 |
| JP | 2009295618 A | 12/2009 |
| JP | 2016171070 A | 9/2016 |

OTHER PUBLICATIONS

Keyence Corporation, "Introduction to surface roughness measurement, surface roughness edition", https://www.nsfellows.com/files/user/site/hyoumenarasa.pdf, 2013, 25 pages.
International Search Report in PCT/JP2022/041338, mailed Jan. 31, 2023, 2 pages.
Written Opinion in PCT/JP2022/041338, mailed Jan. 31, 2023, 4 pages.
Official Communication issued in corresponding Chinese Patent Application No. 202280080519.8, mailed on Aug. 19, 2025, 7 pages.

* cited by examiner

RELATIONSHIP BETWEEN SKEWNESS (Rsk)
AND NUMBER OF ADHERING ELECTRONIC COMPONENTS $$Rsk = \frac{1}{Rq^3}\left\{\frac{1}{l}\int_0^l Z(x)^3 dx\right\}$$

RELATIONSHIP BETWEEN ARITHMETIC MEAN ROUGHNESS (Ra)
AND NUMBER OF ADHERING ELECTRONIC COMPONENTS $$Ra = \frac{1}{l} \int_{0}^{l} |Z(x)| \, dx$$

RELATIONSHIP BETWEEN ROOT−MEAN−SQUARE ROUGHNESS (Rq)
AND NUMBER OF ADHERING ELECTRONIC COMPONENTS $$Rq = \sqrt{\frac{1}{l} \int_0^l Z(x)^2 dx}$$

ELECTRONIC COMPONENT CONTAINER

CROSS REFERENCE TO RELATED APPLICATIONS

This application claims the benefit of priority to Japanese Patent Application No. 2022-003060 filed on Jan. 12, 2022 and is a Continuation Application of PCT Application No. PCT/JP2022/041338 filed on Nov. 7, 2022. The entire contents of each application are hereby incorporated herein by reference.

BACKGROUND OF THE INVENTION

1. Field of the Invention

The present invention relates to electronic component containers to accommodate electronic components such as chip components.

2. Description of the Related Art

Electronic components accommodated in an electronic component container are discharged through a discharge port of the electronic component container, and then, are mounted on a board. For example, Japanese Unexamined Patent Application, Publication No. 2009-295618 discloses an electronic component container that accommodates a number of electronic components in bulk, and has, at a bottom thereof, a discharge port through which the electronic components are allowed to fall under their own weight onto a feeder.

A known electronic component container has a disadvantage that, during transportation of the container having electronic components accommodated therein, some of the electronic components adhere to an inner wall surface of the container, and remain in the container when the electronic components are to be taken out. The inventor of example embodiments of the present invention conducted extensive investigations and discovered that the surface roughness of an inner wall surface defining a component accommodating space of an electronic component container has an influence on the number of remaining electronic components.

SUMMARY OF THE INVENTION

Example embodiments of the present invention provide electronic component containers each able to reduce or prevent a quantity of electronic components adhering to an inner wall surface of the electronic component containers by adjusting a surface roughness of an inner wall surface thereof.

An example embodiment of the present invention provides an electronic component container including a component accommodating space to accommodate a plurality of electronic components, and a discharge port through which the electronic components accommodated in the component accommodating space are dischargeable to an outside. An inner wall surface of the component accommodating space has a skewness Rsk of about −0.8 or greater and about −0.3 or less.

Example embodiments of the present invention each provide an electronic component container able to reduce or prevent a quantity of electronic components adhering to an inner wall surface of the electronic component container by adjusting a surface roughness of the inner wall surface.

The above and other elements, features, steps, characteristics and advantages of the present invention will become more apparent from the following detailed description of the example embodiments with reference to the attached drawings.

DETAILED DESCRIPTION OF THE EXAMPLE EMBODIMENTS

Example embodiments of the present invention are described in detail below with reference to the drawings.

Electronic Component Container 1

Figure 1:
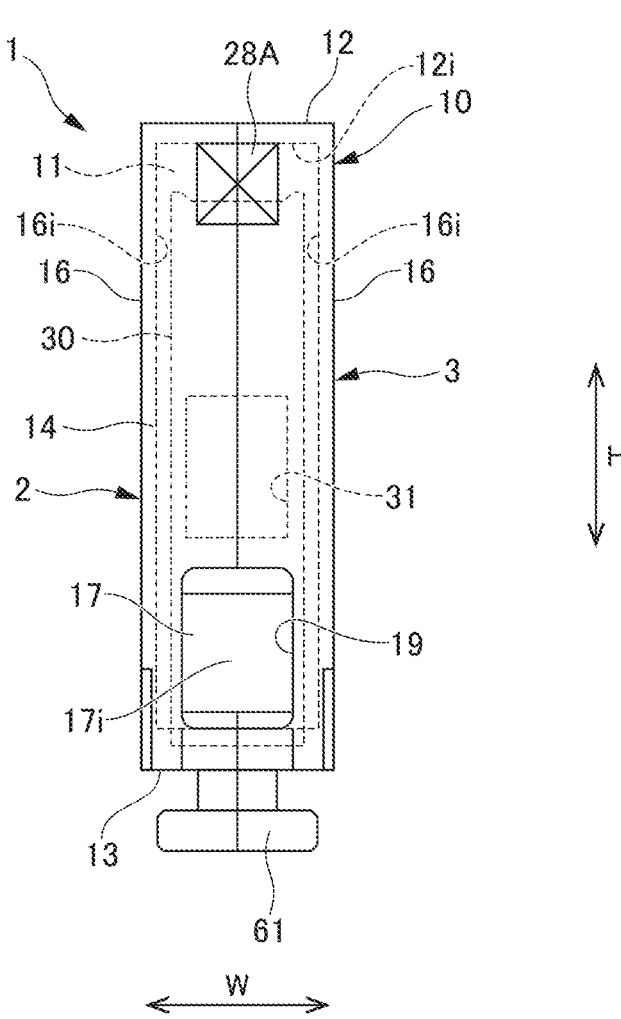
FIG. 1 is a front view of an electronic component container 1 according to an example embodiment of the present invention as viewed from the front.
Figure 2:
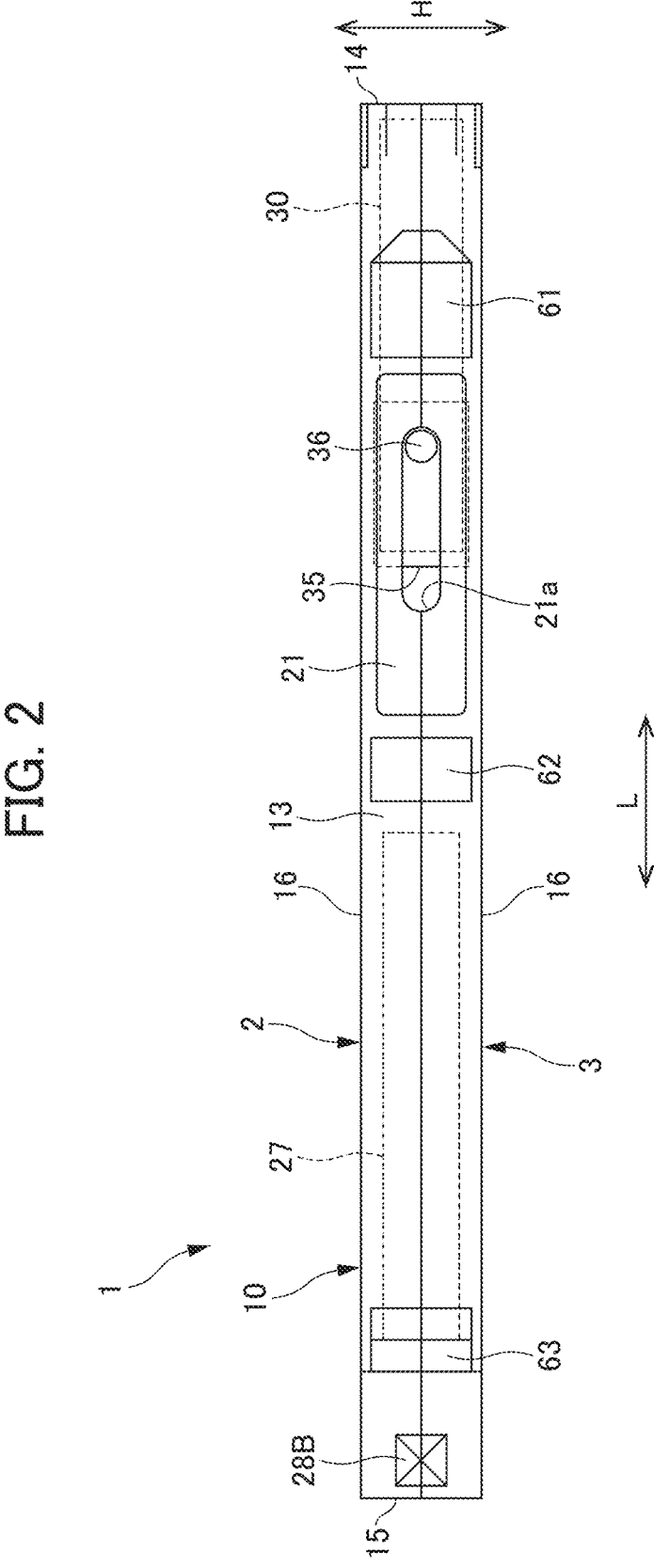
FIG. 2 is a bottom view of the electronic component container 1 as viewed from below.
Figure 3:
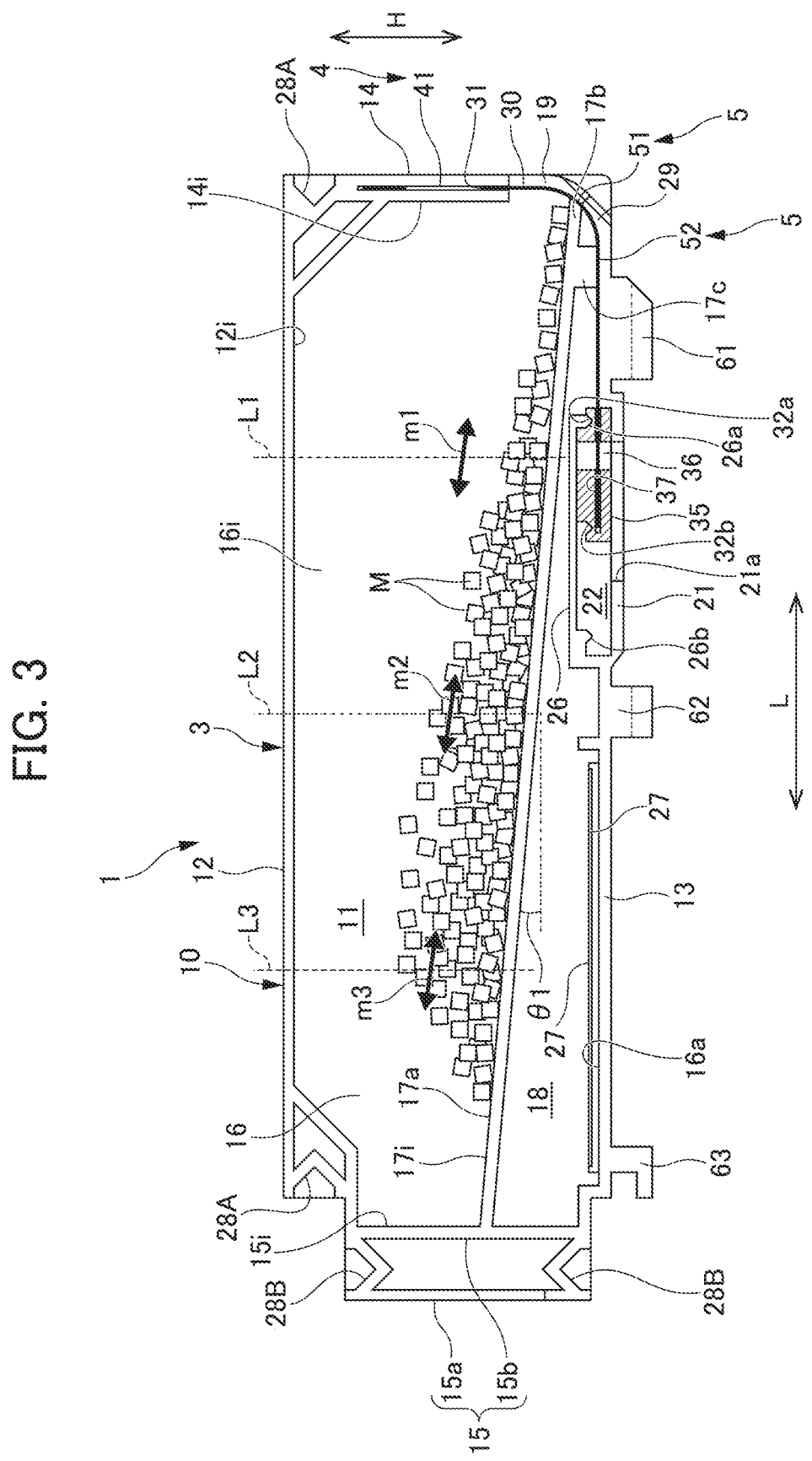
FIG. 3 is a diagram illustrating the interior of the electronic component container 1 as viewed from a side.

An electronic component container 1 according to an example embodiment of the present invention will be described with reference to the drawings. FIG. 1 is a front view of the electronic component container 1 as viewed from the front. FIG. 2 is a bottom view of the electronic component container 1 as viewed from below. FIG. 3 is a diagram illustrating the interior of the electronic component container 1 as viewed from a side.

The electronic component container 1 accommodates therein a plurality of electronic components M in bulk. The electronic component container 1 including the plurality of electronic components M accommodated therein is set to a feeder (not shown), and the electronic components M are discharged from the electronic component container 1 due to vibration of the feeder and supplied to a mounting device or the like. The electronic component M of the present example embodiment is, for example, a small rectangular or substantially rectangular parallelepiped electronic component having, for example, a length of about 1.2 mm or less in the longitudinal direction. Examples of such an electronic component M include a capacitor, an inductor, etc., but the present example embodiment is not limited thereto.

Arrows W, L, and H in the drawings to which reference is made respectively indicate the left-right direction W, the front-rear direction L, and the up-down direction H of the electronic component container 1 in a use state in which the electronic component container 1 is set to the feeder.

The electronic component container 1 includes a first portion 2 and a second portion 3 that are separable in a left-right direction. The first portion 2 and the second portion 3 are molded bodies made of resin such as, for example, ABS resin or the like. The first portion 2 and the second portion 3 are combined with and joined to each other to define the electronic component container 1. Example of a process for joining the first portion 2 and the second portion 3 include, but are not limited to, ultrasonic bonding and bonding with an adhesive.

FIG. 3 illustrates the interior of the second portion 3 situated on the right side, while the first portion 2 situated on the left side is omitted. The electronic component container 1 has a flat box shape that extends in the front-rear direction L and is thin in the left-right direction W. In the following description, except where necessary, the first portion 2 and the second portion 3 will not be individually described, and the configuration including the first portion 2 and the second portion 3 joined to each other will be described.

The electronic component container 1 includes a container body 10 that accommodates therein a plurality of electronic components M, a discharge port 19 as an opening through which the electronic components M are supplied into and discharged from the electronic component container 1, a shutter 30 that opens and closes the discharge port 19, and a slider 35 that causes the shutter 30 to slide.

Container Body 10

The container body 10 includes a top plate 12 and a bottom plate 13 that extend in the front-rear direction L, a front wall 14 and a rear wall 15 that extend in the up-down direction H, a pair of left and right side walls 16, and an inclined plate 17 that partitions the interior of the container body 10 into upper and lower spaces. The rear wall 15 includes an outer rear wall 15*a* defining an outer surface and an inner rear wall 15*b* provided forward of the outer rear wall 15*a*. A component accommodating space 11 to accommodate the plurality of electronic components M in bulk is provided in the container body 10.

The discharge port 19 is provided in a lower portion of the front wall 14. The discharge port 19 is a rectangular or substantially rectangular opening. The discharge port 19 is not limited to the rectangular or substantially rectangular shape, and may have, for example, a circular or substantially circular shape, an elliptical or substantially elliptical shape, or the like. The discharge port 19 is opened and closed by the shutter 30.

The inclined plate 17 extends between the left and right side walls 16 and extends from the inner rear wall 15*b* to a lower portion of the discharge port 19. The inclined plate 17 is arranged below the center in the up-down direction H of the interior of the container body 10. In the interior of the container body 10, the space above the inclined plate 17 defines and functions as the component accommodating space 11, and the space below the inclined plate 17 defines and functions as a lower space 18.

The inclined plate 17 is inclined downward toward the discharge port 19, and includes an upper surface that is denoted as an inclined surface 17*i* and inclined downward toward the discharge port 19. In the present example embodiment, the inclined surface 17*i* is inclined by an inclination angle θ1 of, for example, about 5° with respect to the horizontal direction in a state in which the electronic component container 1 is set to the feeder. The inclination angle θ1 of the inclined surface 17*i* is preferably, for example, about 3° or greater and about 10° or less. The inclination angle θ1 of the inclined surface 17*i* is appropriately adjusted in accordance with, for example, vibration conditions of the feeder.

In a lower rear portion of the lower space 18, a hole 16*a* extends in the front-rear direction L, and a radio frequency identification (RFID) tag 27 having a strip shape elongated in the front-rear direction L is disposed over the hole 16*a*. The RFID tag 27 has a known configuration including, for example, a transmitter/receiver, a memory, an antenna, and the like. For example, the feeder, to which the electronic component container 1 is set, includes a reader/writer that reads and writes information from and to the RFID tag 27.

The container body 10 includes upper gripping portions 28A and rear gripping portions 28B. The upper gripping portions 28A are a pair of front and rear recesses provided at front and rear ends of an upper portion of the container body 10. The rear gripping portions 28B are a pair of upper and lower recesses provided at upper and lower ends of a rear portions of the container body 10. When the electronic component container 1 is transported by a robot hand, for example, the upper gripping portions 28A or the rear gripping portions 28B are gripped by the robot hand.

The container body 10 includes, on a bottom surface thereof, a plurality of claws that enable detachably mounting the electronic component container 1 on the feeder. In the present example embodiment, a first claw 61, a second claw 62, and a third claw 63 are provided on the bottom surface at intervals in the front-rear direction L. The first claw 61, the second claw 62, and the third claw 63 are provided integrally with the container body 10. Each of the first claw 61 and the second claw 62 is defined by a T-shaped slot having an inverted T-shaped cross section in a plane extending in the up-down direction and the left-right direction. The third claw 63 is a plate-shaped piece extending rearward and having an L-shape in a side view.

The shutter 30 slides to open and close the discharge port 19. The shutter 30 continuously extends from the bottom plate 13 to the front wall 14, and is slidable in the extending direction in which it extends. The shutter 30 is an elongated strip-shaped film member. The shutter 30 is made of a flexible material having a certain degree of rigidity and being bendable, such as PET (polyethylene terephthalate), for example. The shutter 30, which is made of such a film-shaped member, may have any thickness, but the thickness is preferably, for example, about 0.1 mm or greater and about 0.5 mm or less, for example. The shutter 30 has a width that is slightly larger than the width of the discharge port 19, and is capable of covering the discharge port 19 without a gap. The shutter 30 includes, at a front end portion thereof, an opening 31 having the same or substantially the same shape as the discharge port 19.

The shutter 30 can slide along a lower guide 5 and an upper guide 4 of the container body 10. The lower guide 5 is disposed above the bottom plate 13, and the upper guide 4 is disposed above the discharge port 19. A rear portion of the shutter 30 slides along the lower guide 5 in the front-rear direction L that is horizontal or substantially horizontal, whereas a front portion of the shutter 30 slides along the upper guide 4 in the up-down direction H. The lower guide 5 and the upper guide 4 each define a passage that slidably holds the shutter 30 while maintaining the plane direction of the shutter 30 along the left-right direction W.

The lower guide 5 includes a first lower guide 51 disposed below the discharge port 19 and a second lower guide 52 disposed rearward of the first lower guide 51. The second lower guide 52 is defined by a gap between the bottom plate 13 and a protrusion 17*c* provided in a front end portion of the inclined plate 17 and protruding downward. The first lower guide 51 is constituted by a front end surface 17*b* of the inclined plate 17 and a front end surface 29 of the bottom plate 13.

In the second lower guide 52, the rear portion of the shutter 30 passes through the gap between the protrusion 17*c* and the bottom plate 13. As a result, the rear portion of the shutter 30 slides in the front-rear direction L immediately above the bottom plate 13. In the first lower guide 51, the shutter 30 slides along the front end surface 29 of the bottom plate 13, which curves in a concave shape in the front-rear direction L, and subsequently, along the front end surface 17*b* of the inclined plate 17, such that the shutter 30 is bent upward at an angle of approximately 90° with respect to the horizontal direction, and then, transitions to a posture extending in the up-down direction H.

The upper guide 4 includes a guide slit 41 provided in the front wall 14 and extending in the up-down direction H. The shutter 30 includes a front end portion inserted into the guide slit 41 from the lower end of the front wall 14, and the front end portion slides in the guide slit 41 in the up-down direction H.

The slider 35 is used to cause the shutter 30 to slide to open and close the discharge port 19. The slider 35 is arranged on a rear end portion of the shutter 30.

The bottom plate 13 of the container body 10 includes a protruding plate portion 21 in a front portion thereof. The protruding plate portion 21 protrudes downward and extends in the front-rear direction L. The protruding plate portion 21 includes a long hole 21*a* extending in the front-rear direction L. A plate portion 26 is disposed above the protruding plate portion 21 with a predetermined space 22 provided therebetween. The plate portion 26 is parallel or substantially parallel to the protruding plate portion 21, and is provided integrally with the bottom plate 13. The space 22 is surrounded by the protruding plate portion 21, the plate portion 26, and the left and right side walls 16. The slider 35 is disposed in the space 22. The plate portion 26 includes, at a front end thereof, a front protrusion 26*a* protruding downward. The plate portion 26 includes, at a rear end thereof, a rear protrusion 26*b* protruding downward.

The slider 35 is a rectangular or substantially rectangular plate-shaped piece elongated in the front-rear direction L. The slider 35 includes a circular operation hole 36 penetrating through the slider 35 in the up-down direction H. The operation hole 36 communicates with the long hole 21*a* of the container body 10, and is exposed to the outside through the long hole 21*a*.

The slider 35 includes a slit 37 provided in a middle in the up-down direction H of the slider 35, extending in the front-rear direction L, and opening at the front side of the slider 35. A rear end portion of the shutter 30 is inserted into the slit 37 through the front end opening. The slit 37 opens at the front side of the slider 35, and includes a closed rear end. The slit 37 may open at the left and right sides of the slider 35. The shutter 30 includes the rear end portion inserted in the slit 37 through the front end opening of the slit 37. The shutter 30 is fixed to the slider 35 by, for example, adhesive or the like. As a result, the shutter 30 can slide together with the slider 35 in the space 22. The slider 35 slides along, and is guided by, the protruding plate portion 21 and the plate portion 26 of the bottom plate 13 and the left and right side walls 16, and thus slidingly moves in the front-rear direction L.

The slider 35 includes a front recess 32*a* and a rear recess 32*b* in a front end portion and a rear end portion of the upper surface, respectively. When the slider 35 slides forward, the front protrusion 26*a* of the plate portion 26 enters and engages with the front recess 32*a*, such that further forward sliding is restricted. At this time, the shutter 30 is positioned such that the opening 31 is positioned above the discharge port 19, and the discharge port 19 is closed by a portion of the shutter 30 below the opening 31.

On the other hand, when the slider 35 slides rearward, the rear protrusion 26*b* of the plate part 26 enters and engages with the rear recess 32*b*, such that further rearward sliding is restricted. At this time, the opening 31 of the shutter 30 coincides with the discharge port 19, and the discharge port 19 is open.

After a predetermined number of electronic components M are supplied into the component accommodating space 11 through the discharge port 19, the electronic component container 1 is shipped to a supply destination of the electronic components M, while having the slider 35 slid forward and the discharge port 19 closed by the shutter 30. FIG. 3 illustrates the interior of the electronic component container 1 at the time of shipment. A user who receives the supply of the electronic component container 1 can open the discharge port 19 in the following manner, for example.

The user inserts an operation pin (not shown) into the operation hole 36 of the slider 35, and moves the operation pin in the direction for the shutter 30 to open the discharge port 19, i.e., in the rearward direction. As a result, the shutter 30 slides rearward in conjunction with the slider 35, and the opening 31 of the shutter 30 becomes coincident with the discharge port 19, thus opening the discharge port 19.

The mechanism to slide the shutter 30 to open and close the discharge port 19 is not limited to the above-described configuration in which the slider 35 is integrated with the shutter 30, and a different mechanism may be adopted.

Roughness of Electronic Component Contact Surface

In the present example embodiment, at least a portion of an electronic component-contact surface, which is a surface of the electronic component container 1 that comes into contact with the electronic components M, has a surface roughness in a predetermined range. The surface roughness is indicated by a skewness Rsk, an arithmetic mean roughness Ra, or a root-mean-square roughness Rq.

Range of Electronic Component-Contact Surface

The electronic component-contact surface includes inner wall surfaces defining the component accommodating space 11 and an inner surface of the discharge port 19, and may include an outer wall surface of the component accommodating space 11. The inner wall surfaces include side wall inner surfaces 16*i* of the pair of left and right side walls 16, the inclined surface 17*i* of the inclined plate 17, a rear wall inner surface 15*i* of the inner rear wall 15*b*, a front wall inner surface 14*i* of the front wall 14, and a top plate inner surface 12*i* of the top plate 12.

At least a portion of the electronic component-contact surface having a surface roughness in the predetermined range includes a portion of the inner wall surfaces that has a largest contact area with the electronic components M. In the electronic component container 1 of the present example embodiment, the side wall inner surfaces 16*i* have the largest contact area with the electronic components M among the inner wall surfaces. Accordingly, the at least a portion of the inner wall surfaces that has a surface roughness within the predetermined range includes the side wall inner surfaces 16*i*.

The at least a portion of the inner wall surfaces having a surface roughness within the predetermined range preferably includes the inclined surface 17*i* in addition to the side wall inner surfaces 16*i*. It is more preferable that the at least a portion of the inner wall surfaces having a surface roughness within the predetermined range includes the rear wall inner surface 15*i* and the front wall inner surface 14*i* in addition to the side wall inner surfaces 16*i* and the inclined surface 17*i*. It is still more preferable that the at least a portion of the inner wall surfaces having a surface roughness within the predetermined range includes the top plate inner surface 12*i* in addition to the side wall inner surfaces 16*i*, the inclined surface 17*i*, the rear wall inner surface 15*i*, and the front wall inner surface 14*i*.

Furthermore, in the at least a portion of the inner wall surfaces having a surface roughness within the predetermined range, the entire or substantially the entire area of the respective inner surface preferably has a surface roughness in the predetermined range. For example, the entire or substantially the entire inner surfaces of the two side walls 16 preferably have a predetermined surface roughness. However, the present invention is not limited to a configuration in which the entire or substantially the entire area of the respective inner surface has the predetermined roughness, and a portion of the respective inner surface may have the predetermined roughness. In the latter case, it is preferable that a portion of the respective inner surface includes an area which is highly likely to come into contact with the electronic components M.

Predetermined Range of Surface Roughness

When the discharge port 19 is open, the electronic components M slides on the inclined surface 17*i* to be discharged from the component accommodating space 11 of the electronic component container 1. However, some of the electronic components M adhere to the inner wall surfaces of the electronic component container 1 and remains there without being discharged. The number of such remaining electronic components tends to increase as the surface roughness of the inner wall surface increases. Therefore, a value at which the number of the remaining electronic components reaches the upper limit of an allowable range is set as the upper limit of the surface roughness. On the other hand, a decrease in the surface roughness of the inner wall surfaces of the component accommodating space 11 of the electronic component container 1 involves an increase in the number of manufacturing steps and an increase in the manufacturing cost. Therefore, a value allowable in terms of manufacturing is set as the lower limit of the surface roughness.

Skewness Rsk

The skewness Rsk as one of the indicators of the surface roughness in the predetermined range, which at least a portion of the inner wall surfaces defining the component accommodating space 11 has, is preferably, for example, in the range of about −0.8 or greater and about −0.3 or less, and more preferably about −0.76 or greater and about −0.38 or less in the present example embodiment. The skewness Rsk represents a degree of symmetry of a peak and a valley with respect to an average line. When the skewness Rsk is equal to 0, there is normal distribution that is symmetrical with respect to the average line. The skewness Rsk is calculated according to the equation shown in FIG. 4. The definition of the skewness Rsk is based on the standard described in JIS B 0601. The skewness Rsk represents a cubic average of a height curve $Z(x)$, which is an amplitude centered on an average line with respect to a reference length that is made dimensionless by a cube of a root-mean-square roughness Rq (to be described later) of a contour curve (height curve). The skewness Rsk represents a degree of asymmetry with respect to the probability density function of the height curve. In the equation shown in FIG. 4, the alphabetical letter "l" represents the length in an X-axis direction of a height curve that is used to determine the characteristics of the height curve. $Z(x)$ represents a height at an arbitrary position x and is an ordinate value. When the skewness Rsk is greater than 0, a bias is present below the average line, and when the skewness Rsk is less than 0, a bias is present above the average line. The skewness Rsk is a parameter deeply related to tribology (friction).

Arithmetic Mean Roughness Ra

The arithmetic mean roughness Ra as one of the indicators of the surface roughness in the predetermined range, which at least a portion of the inner wall surfaces defining the component accommodating space 11 has, is preferably, for example, in the range of about 1.5 μm or greater and about 3.5 μm or less in the present example embodiment. The arithmetic mean roughness Ra is an average value of an average height difference from an average surface. The arithmetic mean roughness Ra is calculated according to the equation shown in FIG. 5 in a case where only a reference length is extracted from a height curve in the direction of an average line, the X-axis is taken in the direction of the average line of the extracted portion, the Z-axis is taken in the direction of the longitudinal magnification, and the height curve is represented by $Z(x)$.

Root-Mean-Square Roughness Rq

The root-mean-square roughness Rq as one of the indicators of the surface roughness in the predetermined range, which at least a portion of the inner wall surfaces defining the component accommodating space 11 has, is preferably, for example, in the range of about 1.8 μm or greater and about 4.5 μm or less in the present example embodiment. The root-mean-square roughness Rq corresponds to the standard deviation of a height distribution representing a root mean square of $Z(x)$ that is the height at an arbitrary position x of a surface, and is calculated according to the equation shown in FIG. 6. Since the root-mean-square roughness Rq is easy to statistically determine and is less susceptible to disturbances such as dust, scratches, and noise, the root-mean-square roughness Rq enables obtaining a stable result. The root-mean-square roughness Rq is preferably larger than the arithmetic mean roughness Ra. In this case, the surface roughness becomes coarser.

Verification Results

A plurality of electronic component containers 1 (A, B, C, D, E, F) made of ABS resin and having different surface roughness were prepared. The surface roughness was adjusted by performing blasting treatment on surfaces of molds using particles of different sizes for different periods of time. For the skewness Rsk, the depth of a valley was adjusted by performing blasting treatment two times using particles of different sizes. For each of the electronic component containers 1 (A, B, C, D, E, F), the skewness Rsk, the arithmetic mean roughness Ra, and the root-mean-square roughness Rq were measured. The electronic component containers 1 (A, B, C, D, E, F) had a surface resistance value of about $10^8$ $\Omega$/cm$^2$ or greater and about $10^{10}$ $\Omega$/cm$^2$ or less, and were relatively antistatic in comparison with typical resin products.

The surface roughness is defined by JIS B 0601-2001 defined by Japanese Industrial Standards Committee. In the present example embodiment, the shape measuring laser microscope VK-X100 (manufactured by KEYENCE CORPORATION) was used, the observation magnification was set to about 200× (10× objective, 1350×1012 μm), the measurement was conducted at a resolution of about 1.36 μm/pixel, and the mode was based on JIS B0601-2001 (ISO4287:1997).

Measurement Positions

The measurement of the surface roughness of the inner wall surfaces defining the component accommodating space 11 was conducted on the inner wall surface having the largest contact area with the electronic components M. In the present example embodiment, the two side wall inner surfaces 16i have the largest contact area with the electronic components M, and one of the side wall inner surfaces 16i was subjected to the measurement. In the present example embodiment, the inner wall surfaces defining the component accommodating space 11 are all produced in the same or substantially the same manner, and accordingly, have the same or substantially the same surface roughness.

Surface roughness values (the skewness Rsk, the arithmetic mean roughness Ra, and the root-mean-square roughness Rq) were measured at three arbitrarily-selected positions on the side wall inner surface 16i, and the average value of the surface roughness values was defined as the surface roughness of the surface. As illustrated in FIG. 3, the three arbitrarily-selected positions of the present example embodiment were set as follows. This is a non-limiting example. Three lines L1, L2, and L3 extending in the H direction were drawn at equal or substantially equal intervals on the side wall inner surface 16i. Here, in the Y direction, the distance between the front wall inner surface 14i and the line L1, the distance between the lines L1 and L2, the distance between the lines L2 and L3, and the distance between the line L3 and the rear wall inner surface 15i are equal or substantially equal to each other. Furthermore, straight lines m1, m2, and m3 having a length of about 4 mm and extending in parallel or substantially in parallel with the inclined surface 17i were drawn such that the straight lines m1, m2, and m3 had the midpoint at a position approximately ⅓ of the distance between the inclined surface 17i and the top plate inner surface 12i from the respective intersections of the lines L1, L2, and L3 and the inclined surface 17i. The surface roughness value on the straight lines m1, m2, and m3 were measured, and a value obtained by averaging the measured surface roughness values was defined as the surface roughness of each of the electronic component containers 1 (A, B, C, D, E, F).

Next, 10,000 pieces of electronic components having a size of about 0.4 mm×about 0.2 mm×about 0.2 mm were supplied into the component accommodating space 11 of each of the electronic component containers 1 (A, B, C, D, E, F), and each electronic component container 1 was set to a feeder. The shutter 30 was slid to open the discharge port 19. Then, the electronic components M slid down along the inclined surface 17i to be discharged through the discharge port 19. At this time, some of the electronic components M adhered to and remained on the inner wall surfaces of the component accommodating space 11 without being discharged through the discharge port 19. The number of the remaining electronic components M was counted. In the present example embodiment, the number of the remaining electronic components M equal to or less than 50 was defined as the allowable range.

Figure 4:
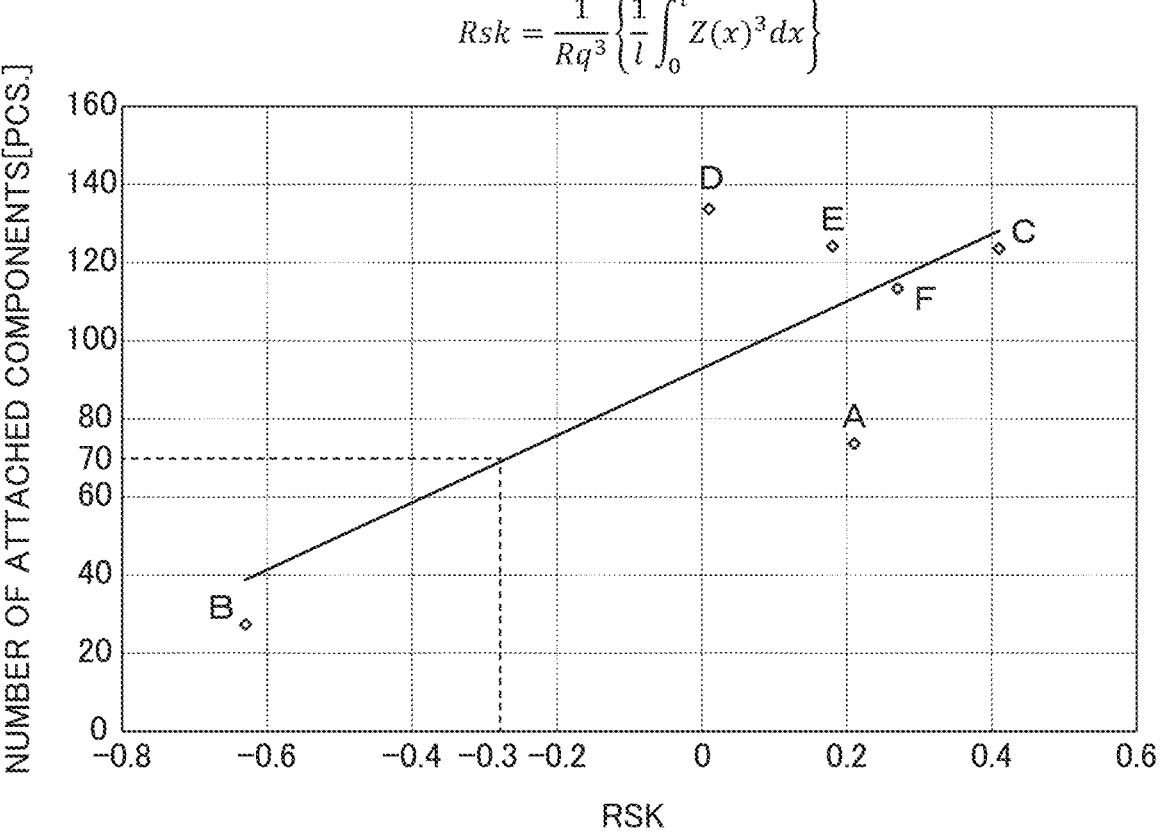
FIG. 4 is a graph illustrating a relationship between a skewness Rsk of the electronic component container 1 and the number of electronic components M that adhered to an inner wall surface and remained in a component accommodating space 11.

FIG. 4 is a graph illustrating a relationship between the skewness Rsk of the electronic component containers 1 (A, B, C, D, E, F) and the numbers (PCS) of the electronic components M that adhered to the inner wall surfaces and remained in the respective component accommodating space 11. The horizontal axis represents the skewness Rsk of the inner wall surface of the component accommodating space 11 of the electronic component containers 1 (A, B, C, D, E, F), and the vertical axis represents the number of electronic components M that remained in the component accommodating space 11. The graph shows an approximate straight line of the numbers of the remaining electronic components in the electronic component containers 1 (A, B, C, D, E, F). As shown in the graph, on the approximate straight line, when the skewness Rsk is about −0.5 or less, which is in the range set in the present example embodiment, the number of the electronic components M remaining in the component accommodating space 11 is 50 or less, i.e., within the allowable range. When the skewness Rsk is set to a negative value, a plane often exists at the bottom of a valley, and the electronic components M are less likely to adhere to the inner wall surfaces of the component container.

Figure 5:
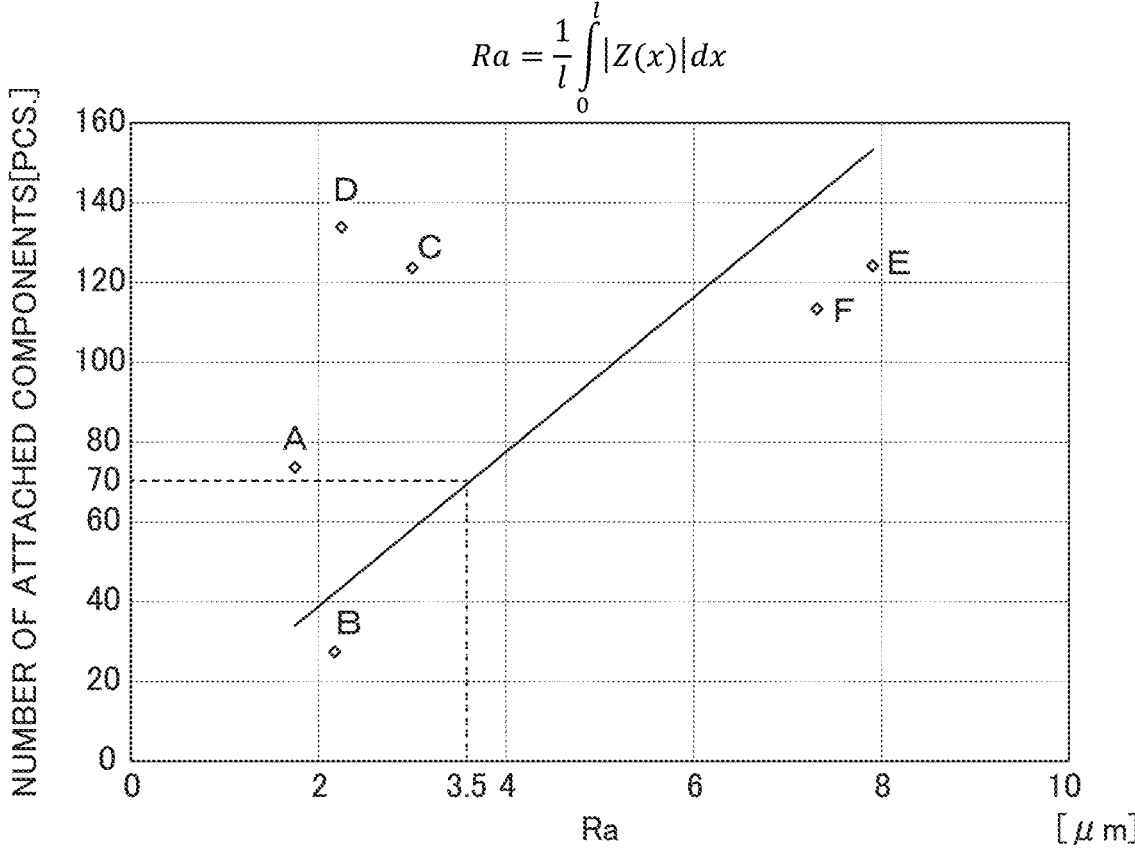
FIG. 5 is a graph illustrating a relationship between an arithmetic mean roughness Ra of the electronic component container 1 and the number of electronic components M that adhered to an inner wall surface and remained in a component accommodating space 11.

FIG. 5 is a graph illustrating a relationship between the arithmetic mean roughness Ra of the electronic component containers 1 (A, B, C, D, E, F) and the number (PCS) of the electronic components M that adhered to the inner wall surfaces and remained in the respective component accommodating space 11. The horizontal axis represents the arithmetic mean roughness Ra (μm) of the inner wall surface of the component accommodating space 11 of the electronic component containers 1 (A, B, C, D, E, F), and the vertical axis represents the number of electronic components M that remained in the component accommodating space 11. The graph shows an approximate straight line that passes through the point of PCS=0 when Ra=0, for the numbers of the remaining electronic components in the electronic component containers 1 (A, B, C, D, E, F). As shown in the graph, when the arithmetic mean roughness Ra is about 2.5 or less, which is in the range set in the present example embodiment, the number of the electronic components M remaining in the component accommodating space 11 is 50 or less, i.e., within the allowable range.

Figure 6:
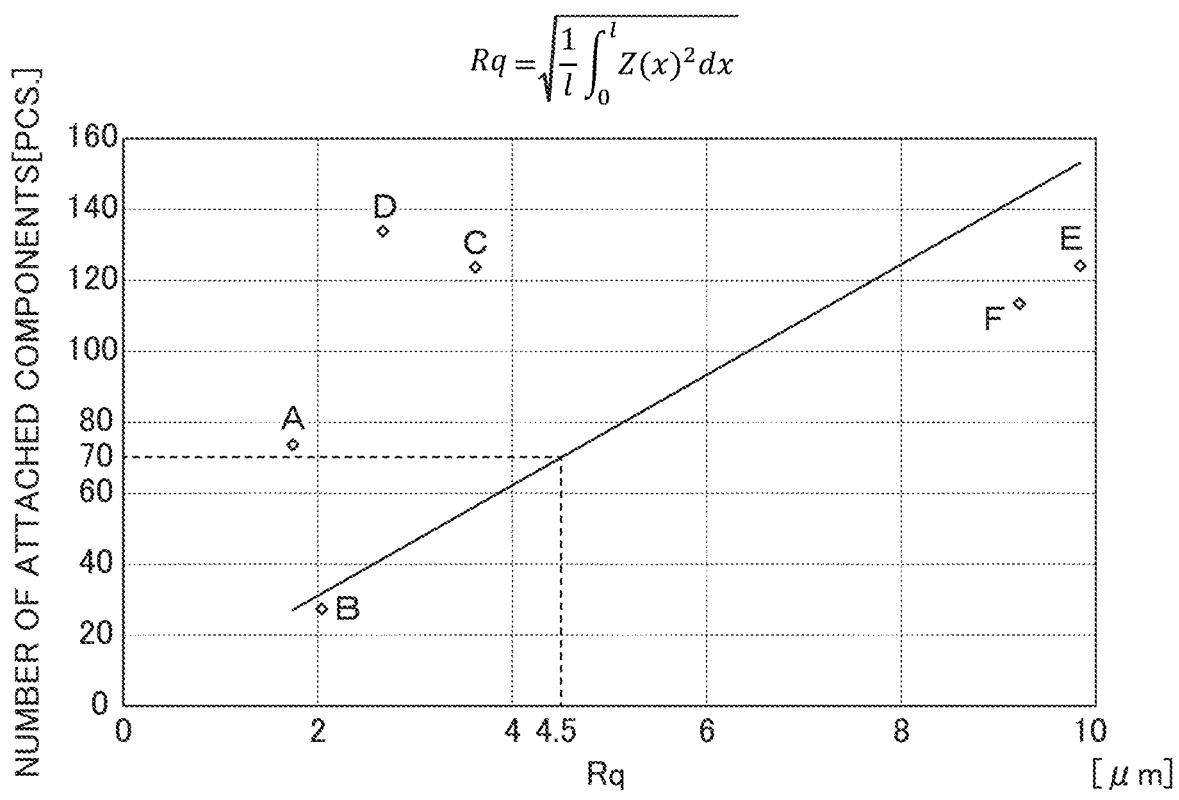
FIG. 6 is a graph illustrating a relationship between a root-mean-square roughness Rq of the electronic component container 1 and the number of electronic components M that adhered to an inner wall surface and remained in a component accommodating space 11.

FIG. 6 is a graph illustrating a relationship between the root-mean-square roughness Rq of the electronic component containers 1 (A, B, C, D, E, F) and the number (PCS) of the electronic components M that adhered to the inner wall surfaces and remained in the respective component accommodating space 11. The horizontal axis represents the root-mean-square roughness Rq (μm) of the inner wall surface of the component accommodating space 11 of the electronic component containers 1 (A, B, C, D, E, F), and the vertical axis represents the number of electronic components M that remained in the component accommodating space 11. The graph shows an approximate straight line that passes through the point of PCS=0 when Rq=0, for the numbers of the remaining electronic components in the electronic component containers 1 (A, B, C, D, E, F). As shown in the graph, when the root-mean-square roughness Rq is about 2.5 or less, which is in the range set in the present example embodiment, the number of electronic components M remaining in the component accommodating space 11 is 50 or less, i.e., within the allowable range.

As described above, by setting the skewness Rsk of the inner wall surface of the component accommodating space 11 to, for example, about −0.3 or less, i.e., within the range set in the present example embodiment, the number of the electronic components M remaining in the component accommodating space 11 can be controlled to 70 or less, which is the allowable range. Furthermore, by setting the skewness Rsk to, for example, about −0.8 or more within the range set in the present example embodiment, the component accommodating space 11 can be easily produced.

By setting the arithmetic mean roughness Ra of the inner wall surfaces defining the component accommodating space 11 to, for example, 3.5 μm or less, i.e., within the range set in the present example embodiment, the number of electronic components M remaining in the component accommodating space 11 can be controlled to 70 or less, which is the allowable range. By setting the arithmetic mean roughness Ra to, for example, about 1.5 μm or more, i.e., within the range set in the present example embodiment, the component accommodating space 11 can be easily produced.

By setting the root-mean-square roughness Rq of the inner wall surfaces defining the component accommodating space 11 to, for example, about 4.5 μm or less, i.e., within the range set in the present example embodiment, the number of electronic components M remaining in the component accommodating space 11 can be controlled to 70 or less, which is the allowable range. By setting the root-mean-square roughness Rq to, for example, about 1.8 μm, i.e., within the range set in the present example embodiment, the component accommodating space 11 can be easily produced.

Since the surface resistance value of the inner wall surfaces defining the component accommodating space 11 is, for example, about $10^8 \ \Omega/cm^2$ or greater and about $10^{10} \ \Omega/cm^2$ or less, the inner wall surfaces defining the component accommodating space 11 is antistatic, and adhesion of the electronic components M to the inner wall surface due to static electricity can be reduced or prevented.

While example embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An electronic component container comprising:
  a component accommodating space to accommodate a plurality of electronic components; and
  a discharge port through which the electronic components accommodated in the component accommodating space are dischargeable to an outside; wherein
  an inner wall surface of the component accommodating space has a skewness Rsk of about −0.8 or greater and about −0.3 or less.

2. The electronic component container according to claim 1, wherein the skewness Rsk of the inner wall surface is about −0.76 or greater and about −0.38 or less.

3. The electronic component container according to claim 1, wherein the inner wall surface has an arithmetic mean roughness Ra of about 1.5 μm or greater and about 3.5 μm or less.

4. The electronic component container according to claim 1, wherein the inner wall surface has a root-mean-square roughness Rq of about 1.8 μm or greater and about 4.5 μm or less.

5. The electronic component container according to claim 1, wherein the electronic component container has a surface resistance value of about $10^8 \ \Omega/cm^2$ or greater and about $10^{10} \ \Omega/cm^2$ or less.

6. The electronic component container according to claim 1, wherein the inner wall surface includes at least a portion of an entirety of inner wall surfaces that surround the component accommodating space.

7. The electronic component container according to claim 1, wherein the inner wall surface includes an inner wall surface that has a largest contact area with the electronic components among an entirety of inner wall surfaces that surround the component accommodating space.

8. The electronic component container according to claim 1, further comprising a first portion and a second portion separable in a left-right direction.

9. The electronic component container according to claim 8, wherein each of the first and second portions are made of resin.

10. The electronic component container according to claim 1, further comprising:
  a container body including the component accommodating space therein;
  a discharge port through which the plurality of electronic components are capable of being supplied and discharged;
  a shutter to open and close the discharge port; and
  a slider to cause the shutter to slide.

11. The electronic component container according to claim 10, wherein the container body includes:
  a top plate and a bottom plate extending in a front-rear direction;
  a front wall and a rear wall extending in an up-down direction;
  a pair of left and right side walls; and
  an inclined plate partitioning an interior of the container body into upper and lower spaces.

12. The electronic component container according to claim 11, wherein the discharge port is at a lower portion of the front wall.

13. The electronic component container according to claim 10, wherein the discharge port has a rectangular or substantially rectangular shape.

14. The electronic component container according to claim 11, wherein the inclined plate extends between the left and right side walls and from the rear wall to a lower portion of the discharge port.

15. The electronic component container according to claim 11, wherein the included plate is positioned below a center in the up-down direction of the interior of the container body.

16. The electronic component container according to claim 11, wherein the inclined plate is inclined at an inclination angle of about 3° or greater and about 10° or less.

17. The electronic component container according to claim 11, wherein the inclined plate is inclined at an inclination angle of about 5°.

18. The electronic component container according to claim 10, wherein
  the container body includes upper gripping portions and rear gripping portions;

the upper gripping portions are defined by a pair of recesses respectively provided in front and rear ends of an upper portion of the container body; and the rear gripping portions are defined by a pair of recesses respectively provided at upper and lower ends of a rear portion of the container body.

19. The electronic component container according to claim 10, wherein the container body includes a plurality of claws on a bottom surface thereof to detachably mount the electronic component on a feeder.

20. The electronic component container according to claim 10, wherein the shutter includes strip-shaped film having a thickness of about 0.1 mm or greater and about 0.5 mm or less.

* * * * *